United States Patent
Bizen et al.

(10) Patent No.: US 8,018,027 B2
(45) Date of Patent: Sep. 13, 2011

(54) FLIP-BONDED DUAL-SUBSTRATE INDUCTOR, FLIP-BONDED DUAL-SUBSTRATE INDUCTOR, AND INTEGRATED PASSIVE DEVICE INCLUDING A FLIP-BONDED DUAL-SUBSTRATE INDUCTOR

(75) Inventors: Tatsuo Rao Bizen, Plano, TX (US); Yinon Degani, Highland Park, NJ (US); Kunquan Sun, Plano, TX (US)

(73) Assignee: Murata Manufacturing Co., Ltd., Kyoto (JP)

( * ) Notice: Subject to any disclaimer, the term of this patent is extended or adjusted under 35 U.S.C. 154(b) by 117 days.

(21) Appl. No.: 12/609,390

(22) Filed: Oct. 30, 2009

(65) Prior Publication Data

US 2011/0101497 A1  May 5, 2011

(51) Int. Cl.
*H01L 29/00* (2006.01)
*H01L 29/76* (2006.01)
*H01L 29/94* (2006.01)
*H01L 31/062* (2006.01)
*H01L 31/113* (2006.01)
*H01L 31/119* (2006.01)
*H01L 23/02* (2006.01)
*H01L 23/48* (2006.01)
*H01L 23/52* (2006.01)
*H01L 29/40* (2006.01)

(52) U.S. Cl. ........ 257/531; 257/379; 257/380; 257/381; 257/516; 257/686; 257/773; 257/777; 257/778; 257/904; 257/E21.022

(58) Field of Classification Search ................. 257/379, 257/380, 381, 516, 531, 686, 773, 777, 778, 257/904, E21.022
See application file for complete search history.

(56) References Cited

U.S. PATENT DOCUMENTS

| | | | |
|---|---|---|---|
| 5,936,831 A | 8/1999 | Kola et al. | |
| 6,005,197 A | 12/1999 | Kola et al. | |
| 6,521,480 B1 * | 2/2003 | Mitchell et al. | 438/108 |
| 6,818,978 B1 * | 11/2004 | Fan | 257/777 |
| 6,828,666 B1 * | 12/2004 | Herrell et al. | 257/691 |
| 6,872,902 B2 * | 3/2005 | Cohn et al. | 200/181 |
| 7,122,389 B2 * | 10/2006 | Hamren et al. | 438/18 |
| 7,183,622 B2 * | 2/2007 | Heck et al. | 257/528 |
| 7,185,542 B2 * | 3/2007 | Bang et al. | 73/514.29 |
| 7,232,708 B2 * | 6/2007 | Morkner | 438/109 |
| 7,259,077 B2 | 8/2007 | Degani et al. | |
| 7,274,050 B2 * | 9/2007 | Nishimura et al. | 257/212 |
| 7,327,020 B2 * | 2/2008 | Kwon et al. | 257/686 |
| 7,355,264 B2 * | 4/2008 | Degani et al. | 257/531 |
| 7,382,056 B2 | 6/2008 | Chiu et al. | |
| 7,417,293 B2 * | 8/2008 | Chen et al. | 257/433 |
| 7,459,381 B2 * | 12/2008 | Sutardja | 438/499 |
| 7,564,066 B2 * | 7/2009 | Zhou et al. | 257/81 |

(Continued)

*Primary Examiner* — Ida M Soward
(74) *Attorney, Agent, or Firm* — Keating & Bennett, LLP (57) ABSTRACT

A flip-bonded dual-substrate inductor includes a base substrate, a first inductor body portion provided on a surface of the base substrate, a cover substrate, a second inductor body portion provided on a surface of a cover substrate, and a nanoparticle bonding material provided between the base substrate surface and the cover substrate surface to electrically connect the first inductor body portion and the second inductor body portion. A method for fabricating a flip-bonded dual-substrate inductor including forming a first inductor body portion on a surface of a base substrate, forming a second inductor body portion on a surface of a cover substrate, and attaching the base substrate surface to the cover substrate surface using a nanoparticle bonding material that electrically connects the first inductor body portion and the second inductor body portion.

7 Claims, 10 Drawing Sheets

U.S. PATENT DOCUMENTS

| | | | |
|---|---|---|---|
| 7,638,875 B2 * | 12/2009 | Chiang | 257/724 |
| 7,667,334 B2 * | 2/2010 | Miller et al. | 257/777 |
| 7,838,337 B2 * | 11/2010 | Marimuthu et al. | 438/110 |
| 2005/0168306 A1 * | 8/2005 | Cohn et al. | 335/78 |
| 2005/0212078 A1 * | 9/2005 | Kwon et al. | 257/516 |
| 2005/0287785 A1 * | 12/2005 | Lee | 438/613 |
| 2007/0045805 A1 * | 3/2007 | Watanabe et al. | 257/686 |
| 2010/0140809 A1 * | 6/2010 | Chow et al. | 257/777 |

* cited by examiner

FLIP-BONDED DUAL-SUBSTRATE INDUCTOR, FLIP-BONDED DUAL-SUBSTRATE INDUCTOR, AND INTEGRATED PASSIVE DEVICE INCLUDING A FLIP-BONDED DUAL-SUBSTRATE INDUCTOR

BACKGROUND OF THE INVENTION

1. Field of the Invention

The present invention relates to integrated passive devices (IPDs) which are flip bonded to one another, and more particularly, to IPDs which are flip bonded using nano junction technology, such as nanoparticle bonding bumps.

2. Description of the Related Art

Radio-frequency (RF) electrical circuits frequently use passive devices and passive device circuits. Many of these RF electrical circuits are used in hand-held wireless products. Accordingly, miniaturization of passive devices and passive device circuits is an important goal in RF device technology.

Recent advances in passive device technology have produced IPDs wherein inductors, capacitors, and resistors are integrated on a single compact substrate. IPD substrates are large and are preferably made of silicon, but in some cases are made of ceramic. IPD substrates and manufacturing methods of IPD substrates can be found in U.S. Pat. No. 7,382,056, the entire contents of which are herein incorporated by reference.

The design of inductor components in these IPDs usually has two goals: a compact space and high Q-factor. In general, inductor devices require conductors that are arranged side-by-side along a substantial length of the conductors. Current flows in the same direction through the side-by-side conductors so that the magnetic flux lines are in the same phase. This results in a large mutual inductance. Straight conductors achieve this goal in principle but require excessive linear space in a conventional IPD. Conductors that are spiral-shaped or have a configuration including nested-squares or nested-rectangles achieve the desired result in a more compact space.

The other goal, high Q-factor, seeks high performance (inductance value) with low power loss. Several factors influence the Q-factor. The inductance value depends on the length and spacing of the conductors. The power loss depends on the conductivity of the metal. The conductivity depends on the width and thickness of the conductors. Thus, several parameters are involved in the design considerations for high Q-factor inductors.

However, some of the design goals are in conflict with each other. For example, for small, compact IPDs, it is desirable to shrink the interconnections, which increases the resistance of the inductor conductors and reduces the Q-factor of the inductor. To offset this, the conductivity of the conductor can be increased by switching from aluminum, which is the standard metal used to form the conductor, to copper. Another proposal is to coat the aluminum conductors with a copper strike layer.

Another approach is to increase the length of the inductor. Nominally, it would appear that increasing the inductor length would require increased surface area. However, it has been recognized that inductor design is not restricted to two dimensions. Accordingly, three-dimensional IPDs, i.e. devices built on multiple levels, have been developed. Multiple level inductors produce multiplied inductor values for a given surface area.

With the proven advantages of two-level inductors, additional levels, for example, four levels, would appear to be the next step. However, each added level in an IPD substrate increases costs. This is especially the case where the added levels serve only the inductor elements.

An approach to constructing three-dimensional inductors for IPDs is disclosed in U.S. Pat. No. 7,355,264, the entire contents of which are herein incorporated by reference. This approach involves constructing a portion of the inductor on a base substrate and constructing a mating portion of the inductor on a cover substrate. The cover substrate is then flip bonded to the base substrate, thus mating the two portions of the inductor. Using this approach, a two level inductor can be constructed without using a multilevel substrate. Using two two-level substrates yields a four-level device.

A benefit of the approach disclosed in U.S. Pat. No. 7,355,264 is that the structure allows different substrates to be used in the two portions. Thus, a silicon IPD substrate can be used for the first portion of the inductor, and a GaAs substrate can be used for the second portion of the inductor. Other components can be built on the substrates according to the particular application. For example, high performance components can be located on the GaAs substrate, and less demanding components can be located on the silicon substrate.

In FIG. 5 of U.S. Pat. No. 7,355,264, dielectric layers 51 and 55 are formed over the metal layers 41 and 42, and contact windows 53 and 57 are formed through layers 51 and 55, exposing the metal layers 41 and 42 for electrical contacts. Windows 53 are aligned with windows 57 so that metal layer 41 and contact windows 53 form a mirror image of metal layer 42 and contact windows 57.

In FIG. 6 of U.S. Pat. No. 7,355,264, the electrical contacts 61 and 62 are formed in and on the contact windows 53 and 57. The electrical contacts 61 and 62 are solder bump contacts and can include under bump metallization (UBM). If the metal layers 41 and 42 are copper and the electrical contacts 61 and 62 are copper, then the electrical contacts 61 and 62 bond directly to the metal layers 41 and 42. However, if the metal layers 41 and 42 are aluminum, a special UBM is typically used. The usual practice is to apply a UBM coating to the metal layers 41 and 42 and apply the electrical contacts 61 and 62 (solder bumps) to the coating. The metal or metals used in UBM technology must adhere well to aluminum, be wettable by solder, and be highly conductive.

FIG. 7 of U.S. Pat. No. 7,355,264 shows solder bumps 72 applied to electrical contact 62 on cover substrate 21. Alternatively, solder bumps 71 can be applied to electrical contact 61 on the base substrate 11, or, in some cases, solder bumps 71 and 72 can be applied to electrical contacts 61 and 62, respectively, on both substrates. The solder bumps 71 and 72 are typically applied using a solder paste process.

With both of the base substrate 11 and the cover substrate 21 essentially completed, the base substrate 11 and the cover substrate 21 are assembled together, as shown in FIG. 8 of U.S. Pat. No. 7,355,264, by flip bonding the cover substrate 21 on top of the base substrate 11, by aligning the solder bumps 72 to the electrical contact 61 on the base substrate 11 (or by registering the solder bumps 71 to the electrical contact 62 on the cover substrate 11 or by registering the solder bumps 72 on the cover substrate 21 to the solder bumps 71 on the base substrate 11), and by reflowing the solder bumps 71 and 72 to attach the base substrate 11 and the cover substrate 21 together. The result is a two-level flip-bonded dual-substrate inductor.

In the IPDs disclosed in U.S. Pat. No. 7,355,264, the spacing between the IPD substrates is determined by the combination of the thickness of the dielectric layers, the thickness of the UBM, and the diameter of the solder bumps after reflow.

In addition, to securely bond the IPD substrates together, the diameter of the solder bumps must be greater than a minimum diameter.

Thus, because the solder bumps must be greater than a minimum diameter, the spacing between the IPD substrates must be greater than a minimum distance. Because the spacing between the IPD substrates affects RF performance of the IPDs, the RF performance deteriorates as the spacing between the IPD substrates increases. Thus, it is difficult to achieve desired RF performance with the IPDs disclosed in U.S. Pat. No. 7,355,264. It is also a problem that, because it is difficult to ensure uniform reflow of the solder bumps, it is difficult to ensure consistent distance between the IPD substrates. If the distance between the IPD substrates is inconsistent, then the RF performance of IPD is affected.

In addition, with the solder bumps 71 and/or 72 used in U.S. Pat. No. 7,355,264, the gap between the surfaces of the base substrate 11 and the cover substrate 21 is likely to be unevenly distributed because the space between the surfaces of the base substrate 11 and the cover substrate 21 in the vicinity of one of the solder bumps 71 and/or 72 can be different from the space between the surfaces of the base substrate 11 and the cover substrate 21 in the vicinity of another one of the solder bumps 71 and/or 72. Thus, uneven distribution of the surfaces of the base substrate 11 and the cover substrate 21 deteriorates the RF performance of the IPDs.

SUMMARY OF THE INVENTION

To overcome the problems described above, preferred embodiments of the present invention provide a method for fabricating a flip-bonded dual-substrate inductor and a flip-bonded dual-substrate inductor.

According to a preferred embodiment of the present invention, a method for fabricating a flip-bonded dual-substrate inductor includes the steps of forming a first inductor body portion on a surface of a base substrate, forming a second inductor body portion on a surface of a cover substrate, and attaching the base substrate surface to the cover substrate surface using a nanoparticle bonding material that electrically connects the first inductor body portion and the second inductor body portion.

The method preferably further includes forming at least one first interconnection pad on the first inductor body portion, forming at least one second interconnection pad on the second inductor body portion, and forming at least one nanoparticle bump using the nanoparticle bonding material to connect the at least one first interconnection pad and the at least one second interconnection pad.

The at least one first interconnection pad is preferably made of one of Al, Au, or Cu, and the at least one second interconnection pad is preferably made of one of Al, Au, or Cu. The nanoparticle bonding material preferably includes one of Ag nanoparticles, Cu nanoparticles, or Au nanoparticles. The at least one nanoparticle bump preferably has a height in a range of about 10 μm to about 50 μm, for example. The step of attaching the base substrate surface to the cover substrate surface is preferably performed at a temperature between about 150° C. and 300° C., for example.

According to a preferred embodiment of the present invention, a flip-bonded dual-substrate inductor includes a base substrate, a first inductor body portion provided on a surface of the base substrate, a cover substrate, a second inductor body portion provided on a surface of a cover substrate, and a nanoparticle bonding material provided between the base substrate surface of the base substrate and the cover substrate surface of the cover substrate to electrically connect the first inductor body portion and the second inductor body portion.

The flip-bonded dual-substrate inductor preferably includes at least one first interconnection pad provided on the first inductor body portion, at least one second interconnection pad provided on the second inductor body portion, and at least one nanoparticle bump defined by nanoparticle bonding material connecting the at least one first interconnection pad and the at least one second interconnection pad.

According to a preferred embodiment of the present invention, an integrated passive device includes a substrate, at least one thin-film capacitor provided on the substrate, and at least one flip-bonded dual-substrate inductor provided on the substrate. The flip-bonded dual-substrate inductor includes a base substrate, a first inductor body portion provided on a surface of the base substrate, a cover substrate, a second inductor body portion provided on a surface of a cover substrate, and a nanoparticle bonding material provided between the base substrate surface of the base substrate and the cover substrate surface of the cover substrate to electrically connect the first inductor body portion and the second inductor body portion.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be discussed below with reference to the FIGS. 1-10.

Figure 1:
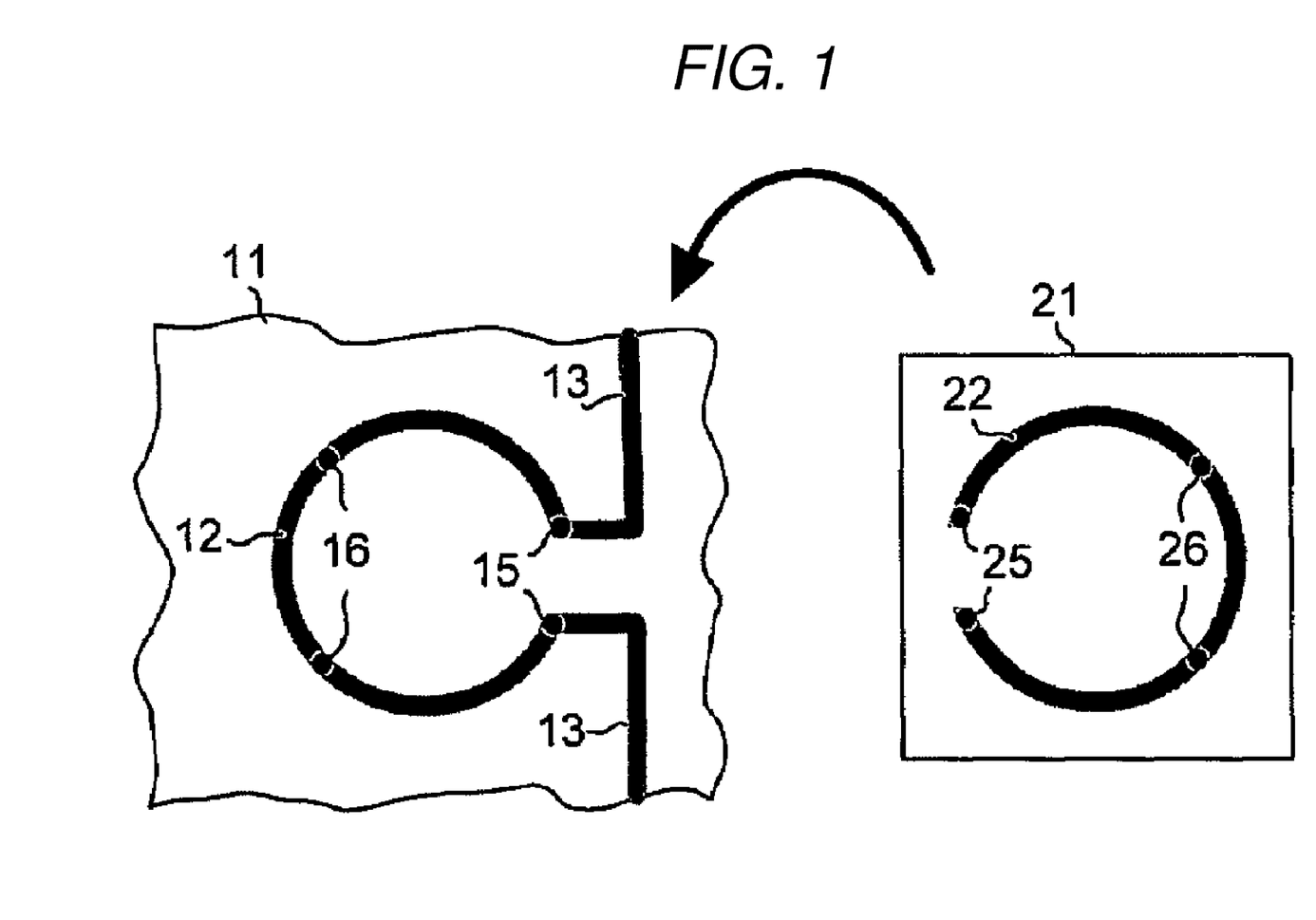
FIG. 1 is a plan view of two substrates comprising two inductor halves prior to flip bonding according to a preferred embodiment of the present invention.
Figure 2:
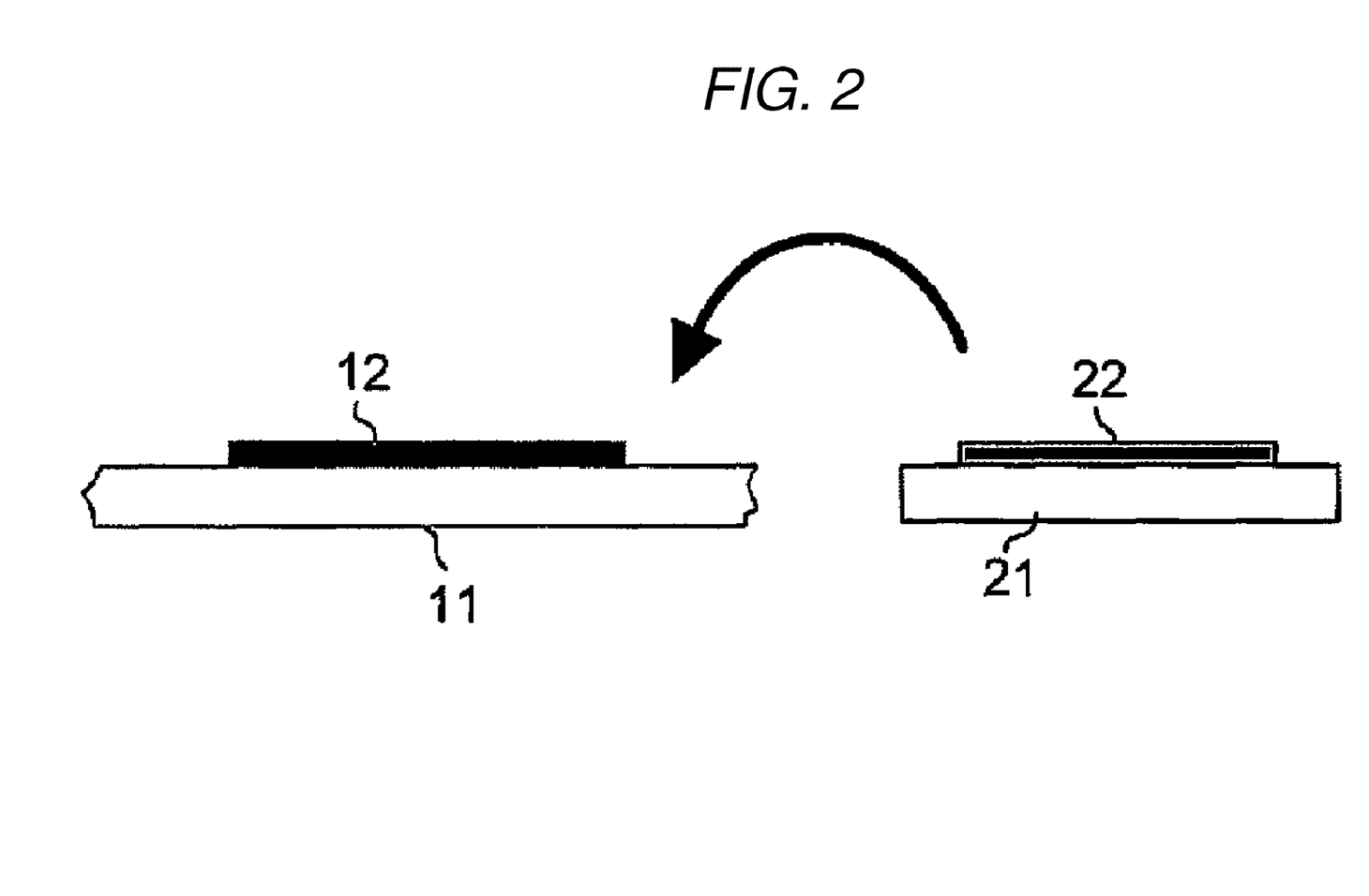
FIG. 2 is a side view of the two substrate of FIG. 1.

FIG. 1 is a top view of the base substrate 11 and the cover substrate 21, each having half of the inductor structure disposed thereon. In the present preferred embodiment of the present invention shown in FIG. 1, the inductor bodies 12 and 22 are in the pattern of an arc greater than about 270°. However, other suitable patterns could be used. The inductor body includes a metal conductor, which is preferably aluminum, copper, or other suitable conductive material. Conductors 13 connect to the inductor body 12 on the base substrate 11. Mating interconnection pads 15 and 25 connect the two halves of the inductor bodies 12 and 22. Intermediate interconnection pads 16 and 26 are optional. The base substrate 11 and the cover substrate 21 are shown in a side view in FIG. 2.

Base substrate 11 is illustrated as a portion of a larger substrate. Typically one or both of the base substrate 11 and the cover substrate 21 will include additional circuitry. The additional circuitry may include other IPD elements such as capacitors and resistors, as well as active device such as transistors.

Figure 3:
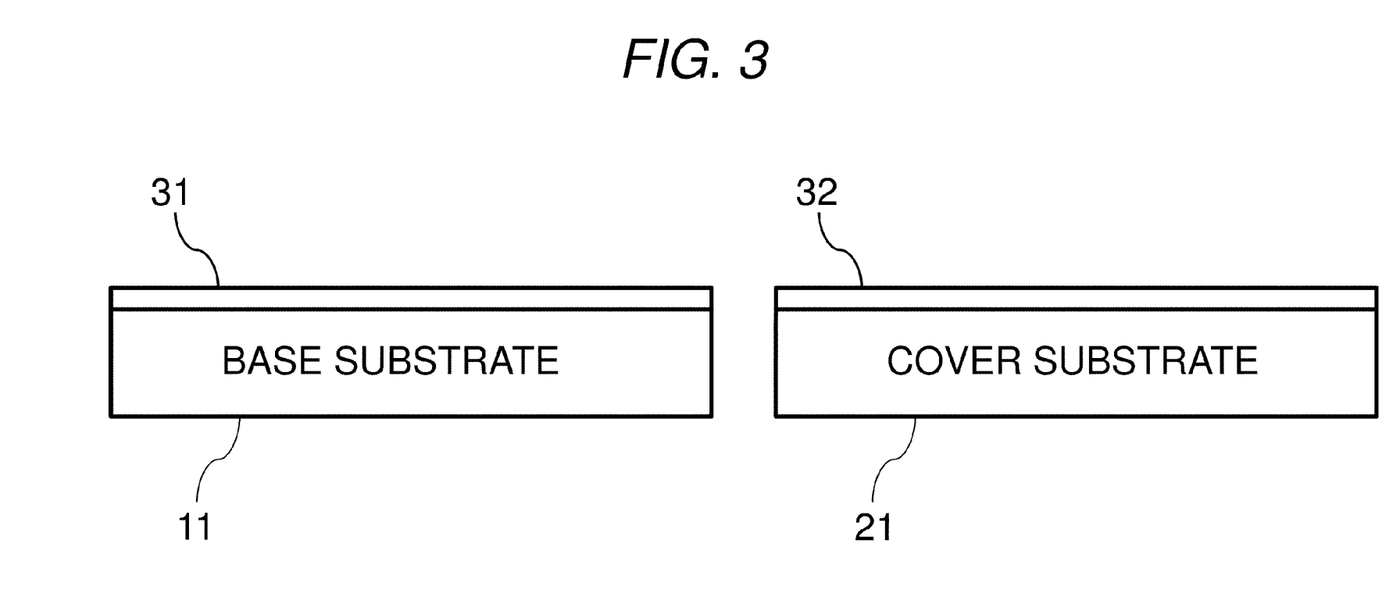
FIGS. 3-5 illustrate steps in the manufacturing of a flip-bonded dual-substrate inductor according to a preferred embodiment of the present invention.
Figure 4:
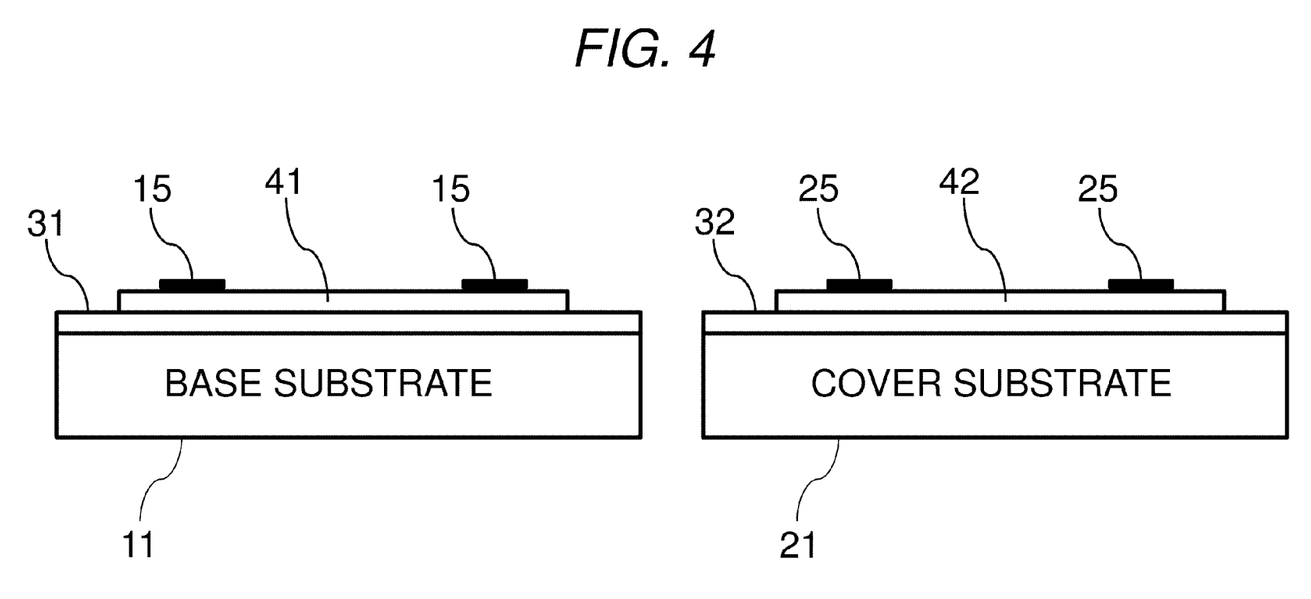
Figure 5:
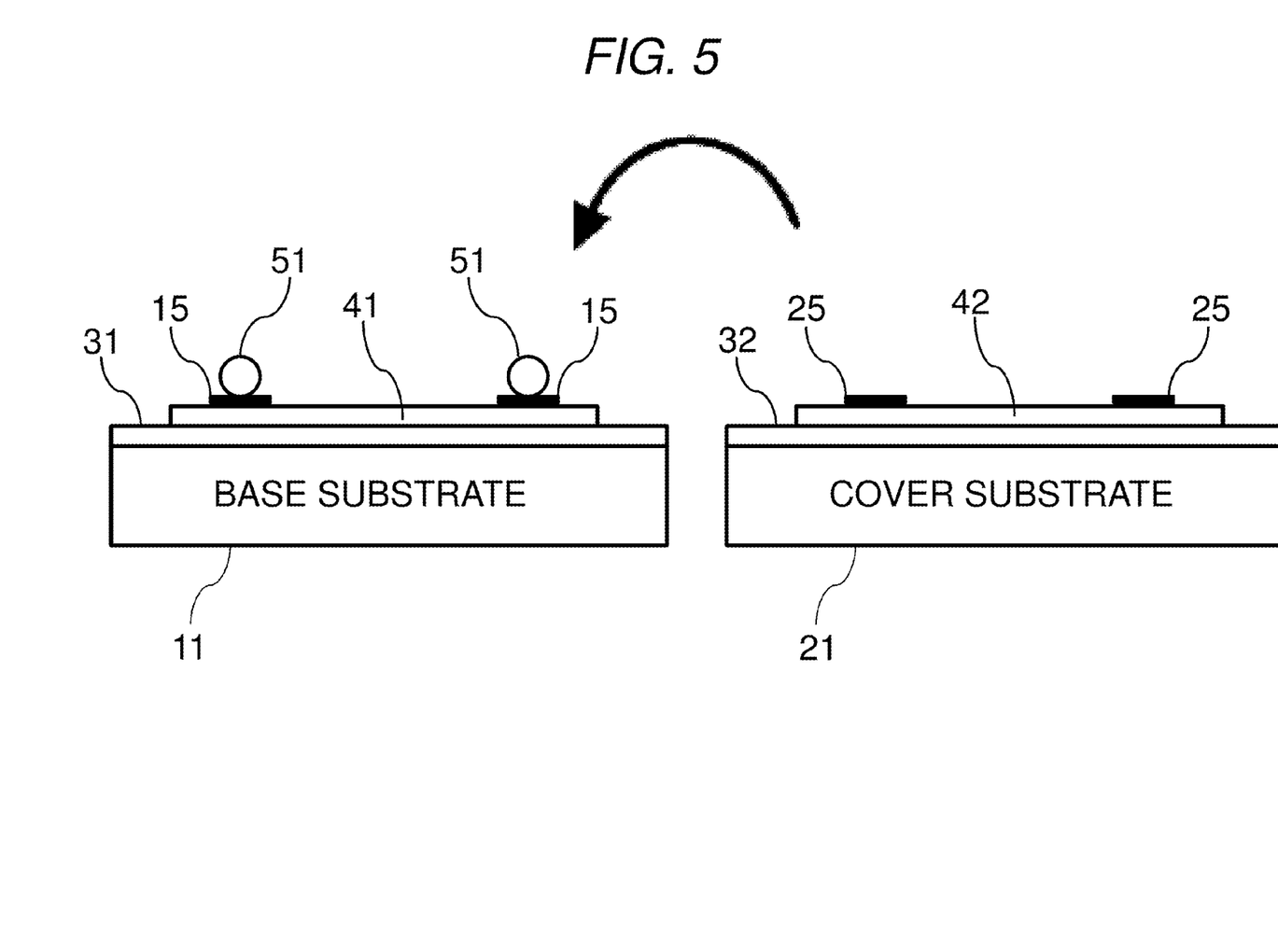
Figure 6:
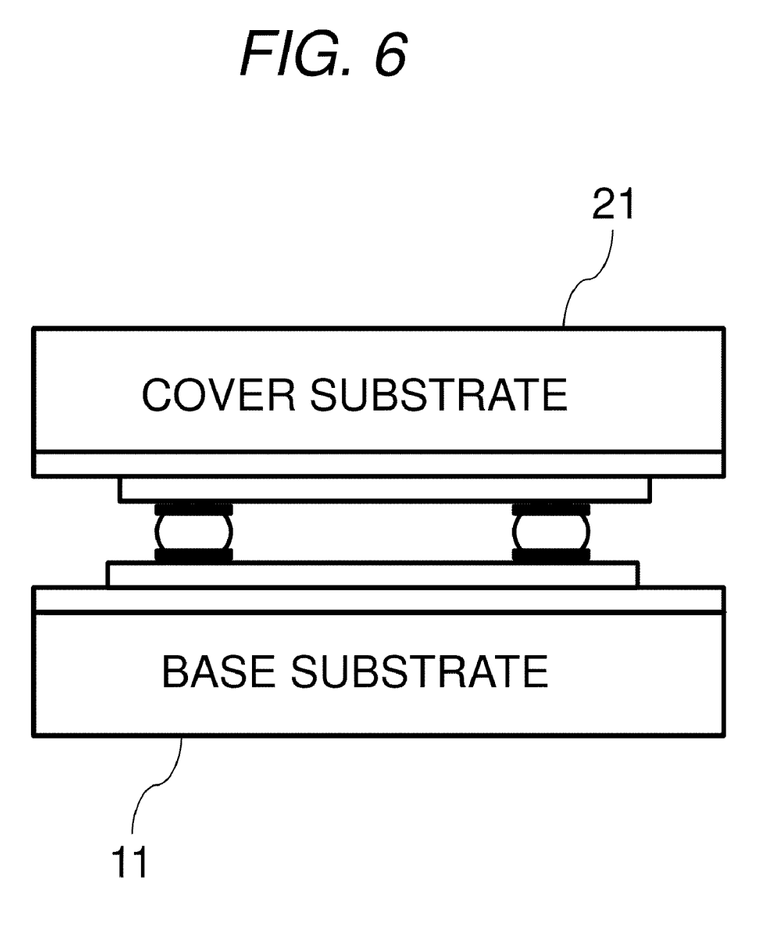
FIG. 6 illustrates a completed flip-bonded dual-substrate inductor according to a preferred embodiment of the present invention.

FIGS. 3-5 show a manufacturing method of the flip-bonded dual-substrate inductors according to preferred embodiments of the present invention. A finished two-level inductor is shown in FIG. 6.

Referring to FIG. 3, the base substrate 11 and the cover substrate 21 are coated with insulating layers 31 and 32, respectively, for example, $SiO_2$ or any other suitable insulating material, by growing or blanket depositing the oxide on a surface of each the base substrate 11 and the cover substrate 21. Preferably, the same oxide will be used on both the base substrate 11 and the cover substrate 21. However, if the base substrate 11 and the cover substrate 21 are made of different materials, different insulating materials can be used.

In FIG. 4, patterned metal layers 41 and 42 are formed on the insulating layers 31 and 32, respectively. The metal layers 41 and 42 can be deposited by any suitable process. A preferred method, for example, is to blanket deposit a metal layer, then mask the layer with a mask, e.g. a photolithographic mask, in the pattern desired, and etch away the exposed portions. By this process, the metal layer 41 on the base substrate 11 forms a first inductor body portion, and the metal layer 42 on the cover substrate 21 forms a second inductor body portion. The first and second inductor body portions are structured to define mating halves, to be joined at the mating interconnection pads 15 and 25 by flipping the cover substrate 21 over the base substrate 11 (or vice versa). Accordingly, first and second inductor body portions are preferably mirror images of one another.

The flip-bonded dual-substrate inductor structure is preferably one in which the inductor body on the cover substrate 21 is substantially a mirror image of the inductor body on the base substrate 11. This configuration is effective because the upper and lower conductors have coupling magnetic fields along their entire length. However, those skilled in the art will recognize that partial coupling will also achieve useful and desirable results. This means that the patterns in each of the inductor body portions are not required to be completely congruent. However, the patterns are preferably at least partially congruent. According to preferred embodiments of the present invention, it is sufficient if at least about 30%, preferably about 50%, and ideally about 100% of one of the inductor body portions is congruent with the other inductor body portion on the mating substrate. At least partial congruence between configurations is defined as a relationship at which an area of one configuration directly overlies an area of another configuration when viewed from above. This definition allows incomplete congruence not only along the length of the inductor body, but also along the thickness dimension. Thus, the conductor in one inductor body portion may preferably be wider than the runner in the other inductor body portion, for example. Accordingly, the congruence factor is an area congruence factor. At least about 30% of the area of one inductor body portion preferably directly overlies a corresponding area of the other inductor body portion, for example.

When there is partial congruence, the geometric configuration of one inductor body portion will preferably be at least a partial mirror image of the geometric configuration of the other inductor body portion.

FIG. 5 shows nanoparticle bumps 51 formed on the interconnection pads 15 on the base substrate 11. Alternatively, the nanoparticle bumps 51 can be formed on the interconnection pads 25 on the cover substrate 21. Although the nanoparticle bumps 51 can be formed on both of the interconnection pads 15 and the interconnection pads 25, this is not preferable because this would increase the spacing between the base substrate 11 and the cover substrate 21.

With both the base substrate 11 and the cover substrate 21 essentially completed, the base substrate 11 and the cover substrate 21 are assembled together, as shown in FIG. 6, by flip bonding the cover substrate 21 on top of the base substrate 11 (or vice versa), by aligning the nanoparticle bumps 51 on the base substrate 11 with the interconnection pads 25 on the cover substrate 21 (or by aligning the nanoparticle bumps 51 on the cover substrate 21 with the interconnection pads 15 on the base substrate 11 or by aligning the nanoparticle bumps 51 on the cover substrate 21 with the nanoparticle bumps 51 on the base substrate 11), and sintering the nanoparticle bumps 51 to attach the base substrate 11 and the cover substrate 21 together.

The sintering of the nanoparticle bumps 51 can be performed at a temperature which is significantly below the temperature at which reflowing of the solder bumps of the prior art is performed. For example, when the nanoparticles used to form the nanoparticle bumps 51 is Ag, the sintering can preferably be performed at a temperature between about 150° C. and 300° C., more preferably between about 150° C. and about 200° C., for example. In contrast, conventional Ag solder bumps, such as those taught in U.S. Pat. No. 7,355,264 must be reflowed at a temperature in range from about 900° C. to about 1100° C.

The process of forming the nanoparticle bumps 51 according to a preferred embodiment of the present invention will be described in more detail with reference to FIGS. 7 and 8.

Figure 7:
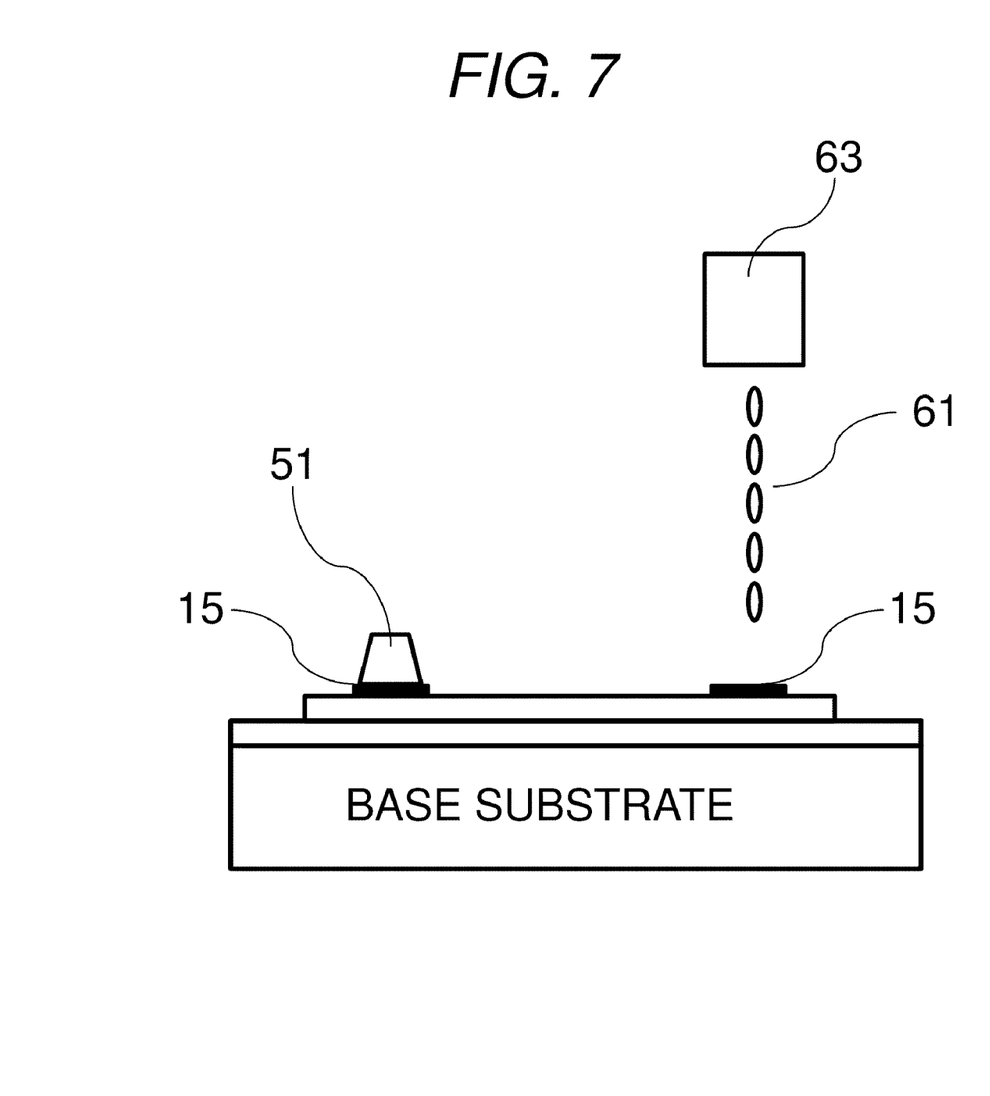
FIG. 7 illustrates an example of a method of forming the nanoparticle bumps according to a preferred embodiment of the present invention.

As shown in FIG. 7, a conductive ink 61 is preferably applied to the interconnection pad 15 using an inkjet head 63. The conductive ink 61 preferably includes a solvent and nanoparticles dispersed therein, for example. The nanoparticles are preferably one of Ag, Cu, or Au nanoparticles, for example. The diameter of the nanoparticles is typically in the ranges of about 1 μm to about 100 μm, for example. The solvent is typically a pure hydrocarbon, such as hexane.

Figure 8:
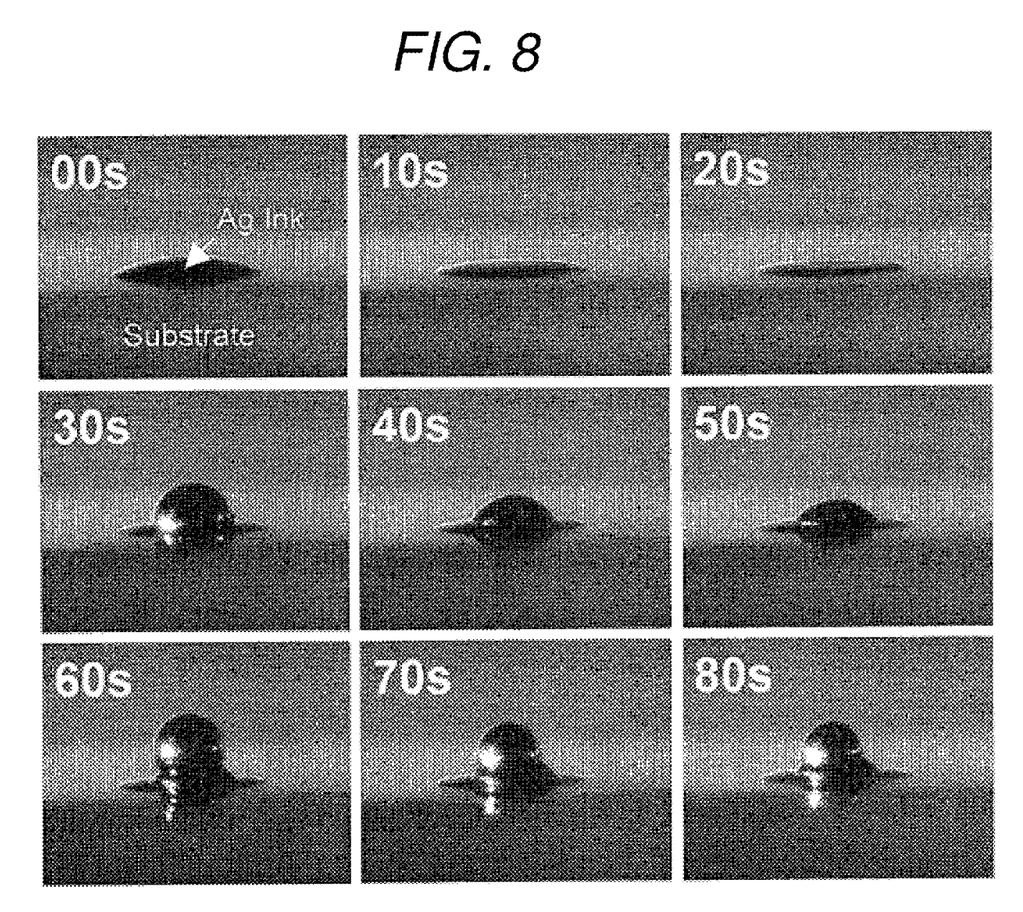
FIG. 8 illustrates the formation of the nanoparticle bumps according to a preferred embodiment of the present invention.

As shown in FIG. 8, the inkjet head 63 preferably applies a plurality of layers of nanoparticles with a desired time interval between the applications of the layers. Preferably, a first layer of conductive ink 61 with nanoparticles and solvent is applied, and then the solvent is allowed to evaporate for about 30 seconds, for example. Then, a second layer of conductive ink 61 with nanoparticles and solvent is applied, and then the solvent is allowed to evaporate for about 30 seconds, for example. Finally, a third layer of conductive ink 61 with nanoparticles and solvent is applied, and then the solvent is allowed to evaporate for about 30 seconds, for example, whereby the nanoparticle bump 51 is formed.

FIG. 8 shows a case in which Ag nanoparticles are used to form the nanoparticle bumps 51. In this case, the substrate on which the nanoparticle bumps 51 are formed is preferably heated to a temperature of about 90° C., for example. However, the substrate can be heated to any suitable temperature, depending on the type of nanoparticles and the type of solvent used, to evaporate the solvent.

The interconnection pads 15 and 25 are preferably made of one of Al, Au, or Cu, for example. Unlike the prior art, when the interconnection pads 15 and 25 are made of Al, the nanoparticle bumps 51 can be directly formed on the Al interconnection pads 15 and 25, and no UMB is required. Thus, the base substrate 11 and the cover substrate 21 can be securely fixed to one another by merely directly forming the nanoparticle bumps on either the Al interconnection pads 15 or 25, and then sintering the IPD to fix the other of the Al interconnection pads 25 or the interconnection pads 25 to the nanoparticle bumps 51.

Although not particularly limited, the nanoparticle bumps 51 are preferably formed to have a height of about 10 μm to about 50 μm, for example, which enables the space between the base substrate 11 and the cover substrate 21 to be greatly reduced while still maintaining sufficient bonding strength between the base substrate 11 and the cover substrate 21, as compared to the prior art. The reduced space between the base substrate 11 and the cover substrate 21 is especially important in IPDs in which a capacitance is formed between the base substrate 11 and the cover substrate 21. Accordingly, the IPDs according to preferred embodiments of the present invention can be manufactured to have desired RF characteristics.

Although not particularly limited, the interconnection pads 15 and 25 preferably have a diameter in the range of about 20 μm to 200 μm, more preferably in the range of about 50 μm to 100 μm, for example. The smaller the diameter, the more difficult it is to align the interconnection pads 15 and 25, and the larger the diameter, the easier it is to align the interconnection pads 15 and 25. However, with larger diameter interconnection pads 15 and 25, more nanoparticle material is needed to form the interconnection pads 15 and 25.

To improve the mechanical strength of the bond between the base substrate 11 and the cover substrate 21, underfill may be provided between base substrate 11 and the cover substrate 21, in addition to the nanoparticle bumps 51. The underfill is preferably made of an epoxy resin with or without an inorganic filler, for example. However, other suitable materials can be used for the underfill as long as the material provides improved mechanical strength.

Figure 9:
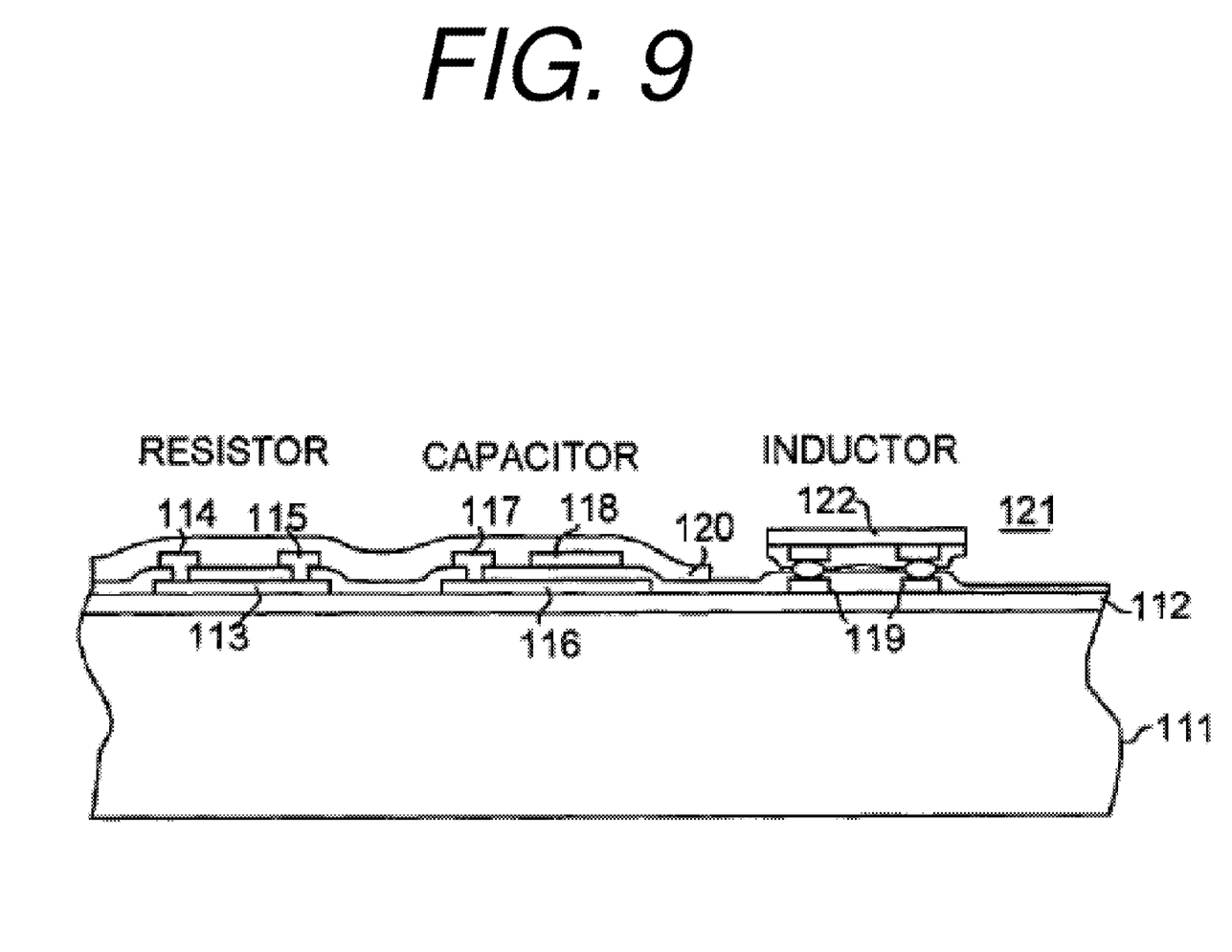
FIG. 9 is a schematic view of an IPD including an inductor according to a preferred embodiment of the present invention.

An IPD incorporating a flip-bonded dual-substrate inductor according to a preferred embodiment of the present invention is illustrated schematically in FIG. 9. The integrated passive elements are generically represented. The substrate 111 is provided with oxide layer 112. The resistor includes a resistor body 113 and contacts 114 and 115. The capacitor includes a lower capacitor plate 116, an upper capacitor plate 118, and a lower capacitor plate contact 117. The flip-bonded dual-substrate inductor 121 includes metal conductors 119. The flip-bonded dual-substrate inductor 121 includes a base substrate 111 and a cover substrate 122 in the present preferred embodiment.

A feature of IPD technology is that elements of more than one component can be defined by the same metal layer. For example, resistor contacts 114 and 115, and capacitor plate contact 117 may be formed using the same processing steps. Upper capacitor plate 118 and one of the inductor spirals 119 (contacts not shown) can formed using the same steps. The structure is preferably protected with polyimide layer 120.

The thin-film passive elements can be formed by a variety of thin film techniques. These techniques are well developed and the specifics need not be reiterated here. See for example, U.S. Pat. No. 6,075,691, the entire content of which is herein incorporated by reference, and U.S. Pat. No. 6,005,197, the entire content of which is herein incorporated by reference. The latter patent describes a multi-layer structure for PCBs, which could easily be adapted for the application described here. A convenient way of defining a thin-film passive device is a passive device that is formed on a substrate using one or more layers, typically a plurality of layers, deposited on the substrate. In addition, as mentioned above, one or more elements of two or more components may be formed using the same processing steps.

Figure 10:
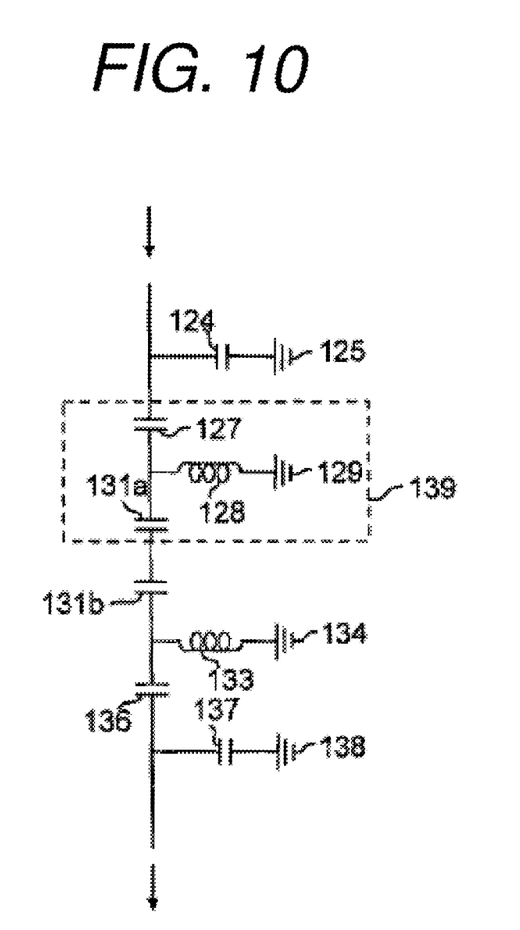
FIG. 10 is an IPD circuit diagram illustrating an IPD circuit.

IPDs have applications for mobile transceivers, wherein the IPDs may function as an RF filter. An example of a typical filter circuit is shown in FIG. 10. The basic structure in this filter circuit is shown in box 139. It includes an LC unit including capacitors 127 and 131a and a flip-bonded dual-substrate inductor 128 connected to ground at 129. In FIG. 10 there are two repeating units shown, the other LC unit includes capacitors 136 and 31b and a flip-bonded dual-substrate inductor 133. This LC combination may be used in repeating units to narrow the band pass and to increase the out-of-band RF rejection of the filter.

Because the sintering of nanoparticle bumps is more reliable and consistent than the reflowing of solder, the spacing between the upper and the lower substrates can be more accurately and consistently controlled. Because the spacing between the upper and the lower substrates of the IPD can be more accurately and consistently controlled, the desired RF performance of the IPD can be more easily achieved. Another advantage of using nanoparticle bumps is that a very thin bump, only a few microns in height, can be achieved. Also, because Ag, for example, is a better conductor than Sn, it is possible to achieve a better electrical connection with nanoparticle bumps than with tin solder.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A flip-bonded dual-substrate inductor comprising:
   a base substrate;
   a first inductor body portion provided on a surface of the base substrate;
   a cover substrate;
   a second inductor body portion provided on a surface of a cover substrate; and
   a nanoparticle bonding material provided between the base substrate surface and the cover substrate surface to electrically connect the first inductor body portion and the second inductor body portion.

2. The flip-bonded dual-substrate inductor of claim 1, further comprising:
   at least one first interconnection pad provided on the first inductor body portion;
   at least one second interconnection pad provided on the second inductor body portion; and
   at least one nanoparticle bump defined by nanoparticle bonding material connecting the at least one first interconnection pad and the at least one second interconnection pad.

3. The flip-bonded dual-substrate inductor claim 2, wherein the at least one first interconnection pad is made of one of Al, Au, or Cu.

4. The flip-bonded dual-substrate inductor of claim 2, wherein the at least one second interconnection pad is made of one of Al, Au, or Cu.

5. The flip-bonded dual-substrate inductor of claim 1, wherein the nanoparticle bonding material includes one of Ag nanoparticles, Cu nanoparticles, or Au nanoparticles.

6. The flip-bonded dual-substrate inductor of claim 2, wherein the at least one nanoparticle bump has a height in a range of about 10 μm to about 50 μm.

7. An integrated passive device comprising:
a substrate;
at least one thin-film capacitor provided on the substrate; and
at least one flip-bonded dual-substrate inductor provided on the substrate; wherein
the flip-bonded dual-substrate inductor comprises:
  a base substrate;
  a first inductor body portion provided on a surface of the base substrate;
  a cover substrate;
  a second inductor body portion provided on a surface of a cover substrate; and
  a nanoparticle bonding material provided between the base substrate surface and the cover substrate surface to electrically connect the first inductor body portion and the second inductor body portion.

* * * * *